United States Patent [19]
Adams et al.

[11] Patent Number: 5,194,401
[45] Date of Patent: Mar. 16, 1993

[54] THERMALLY PROCESSING SEMICONDUCTOR WAFERS AT NON-AMBIENT PRESSURES

[75] Inventors: David V. Adams, San Jose; Roger N. Anderson, Santa Clara; Thomas E. Deacon, San Jose, all of Calif.

[73] Assignee: Applied Materials, Inc., Santa Clara, Calif.

[21] Appl. No.: 873,483

[22] Filed: Apr. 22, 1992

Related U.S. Application Data

[60] Continuation of Ser. No. 436,838, Nov. 15, 1989, abandoned, which is a division of Ser. No. 339,784, Apr. 18, 1989, Pat. No. 4,920,918.

[51] Int. Cl.$^5$ .............................................. H01L 21/26
[52] U.S. Cl. .................................... 437/173; 437/105; 437/81; 118/715; 118/724; 118/50
[58] Field of Search .............. 118/715, 712, 730, 725, 118/724, 723, 50; 437/173, 105, 81; 148/DIG. 169; 422/202, 208

[56] References Cited
FOREIGN PATENT DOCUMENTS 62-193644 8/1987 Japan .

OTHER PUBLICATIONS

Perry's Chemical Engineer's Handbook 6th Edition. Magraw Hill NY, NY 1986 Sec. 11 pp. 11, 26 & 27.
AMC-7810/11 and AMC-7820/21 Cylindrical Epitaxial Reports Chapter 1 General Information.
IBM Technical Disclosure Bulletin "Rectangular Vapor Growth Reactor," Doo et al.

*Primary Examiner*—Brian E. Hearn
*Assistant Examiner*—Kevin M. Picardat
*Attorney, Agent, or Firm*—Birgit E. Morris

[57] ABSTRACT

A thermal reactor system for semiconductor processing incorporates a reaction vessel with a rectangular quartz tube with reinforcing parallel quartz gussets. The gussets enable sub-ambient pressure processing, while the rectangular tube maximizes reactant gas flow uniformity over a wafer being processed. The gussets facilitate effective cooling, while minimally impairing heating of the wafer by allowing minimal wall thickness. The thermal reactor system further includes a gas source for supplying reactant gas and an exhaust handling system for removing spent gases from and establishing a reduced pressure within the reaction vessel. An array of infrared lamps is used to radiate energy through the quartz tube; the lamps are arranged in a staggered relation relative to the quartz gussets to minimize shadowing. In addition, other non-cylindrical gusseted vessel geometries are disclosed which provide for improved sub-ambient pressure thermal processing of semiconductor wafers.

7 Claims, 3 Drawing Sheets

THERMALLY PROCESSING SEMICONDUCTOR WAFERS AT NON-AMBIENT PRESSURES

This is a continuation of U.S. application Ser. No. 07/436,838 filed Nov. 15, 1989 abandoned which is a division of U.S. application Ser. No. 07/339,784 filed Apr. 18, 1989 now U.S. Pat. No. 4,920,918.

BACKGROUND OF THE INVENTION

The present invention relates to semiconductor processing and, more particularly, to thermal reactors for chemical vapor deposition, thermal annealing, and other procedures requiring high temperature processing. A major objective of the present invention is to provide an improved thermal reactor for semiconductor processing with relatively uniform reactant gas flow at non-ambient pressures.

Recent technological progress is closely identified with the increasing miniaturization of electronic circuits made possible by advances in semiconductor processing. Certain advanced processing techniques require exposing a semiconductor structure to a reactant gas under carefully controlled conditions of elevated temperature, sub-ambient pressures and uniform reactant gas flow. Examples of such processes include low-pressure chemical vapor deposition, reduced-pressure chemical vapor deposition, and selective epitaxial deposition. Of particular concern is the uniformity of temperature and gas flow to ensure uniform results, e.g., deposition thickness, across a wafer.

A reactor system for implementing ambient and sub-ambient pressure thermal reactions typically includes a reaction chamber, a gas source, an exhaust system, a heat source, and a coolant source. The reaction chamber provides a controlled environment for the desired reaction. The gas source provides the purging and reactant gases, while the exhaust system removes spent gases and maintains the desired sub-ambient pressures. The heating source, which can be an array of infrared lamps or an inductive source, generally transmits energy through the chamber wall to heat the wafer. Generally, the wafer is mounted on a support structure, which can serve as a susceptor to absorb energy transmitted into the chamber and convey the resulting heat to the wafer being processed. In addition, the support can rotate the wafer within the chamber to minimize the effect of spatial anomalies within the chamber. Coolant is applied to the outer surface of the chamber to minimize thermal expansion and distortion of the chamber during deposition, to minimize deposition on the chamber wall, and to assist cooling after deposition.

Quartz is the material of choice for the reaction chamber wall. Its high melting point and low thermal coefficient of expansion tolerate the high temperatures, e.g., over 1100° C., used in some chemical vapor deposition (CVD) reactions. A transparent dielectric, quartz is compatible with both infrared and inductive heating sources, and it facilitates the dissipation of heat after deposition is completed. Furthermore, quartz can be obtained in very pure form, e.g., fused silica, minimizing its role as a source of contamination in a thermal reaction. Quartz is herein defined as a natural or synthetic glass consisting of at least 90% silicon dioxide.

Reaction chamber walls are typically cylindrical, either over the entire chamber length, or over a substantial portion of the chamber length, e.g., as in a bell jar chamber. Cylindrical vessels are the vessels of choice for low pressure applications since they distribute stress due to pressure differential uniformly and do so in spite of variations in wall thickness. The even distribution of stress minimizes the probability of breakage.

On the other hand, the cylindrical geometry prevents a uniform reactant gas flow at a wafer surface. The wafer surface is flat so that, when symmetrically positioned within a cylindrical chamber, the wafer edges furthest from the longitudinal axis of the chamber are closer to the chamber wall than is the wafer center. Thus, a greater reactant gas volume is provided over the wafer center than is provided over the transverse edges of the wafer. This invites uneven depositions, which will impair the yield of integrated circuits from a wafer. While uneven flow is not a problem for diffusion-driven depositions, which can occur at very low pressures of about 1 Torr or less, it is a problem for flow-driven deposition reactions, which are far more prevalent.

The nonuniformity imposed by cylindrical geometry can be minimized using a large radius of curvature. For example, the AMC-7810/11 Cylindrical Epitaxial Reactor, manufactured by Applied Materials, Inc., is designed to process concurrently circumferential rows of wafers arranged around a multi-faceted barrel. On the scale of the individual wafers, the cylindrical chamber wall can be relatively flat, and thus reactant gas flow over the wafer can be relatively uniform. However, as larger wafers are to be processed, scaling such a reactor design is problematic. The volume of hardware required increases much faster than linearly with wafer diameter; the larger volumes and masses involved in larger systems require longer heating and cooling times, impeding throughput. The problem with throughput is further aggravated where, for experimental or custom objectives, a single wafer is to be processed since there is virtually no processing time saved when utilizing such a chamber below capacity.

As the foregoing illustrates, there are conflicting design objectives inherent in chamber design. Reduced-pressure processing indicates cylindrical geometries and small radii of curvature. Uniform reactant flow indicates large radii of curvature, either flat surfaces or very large diameter cylinders. In addition, chamber wall curvature can distort radiant energy transmitted therethrough, thus causing a wafer to heat unevenly. Uneven heating can result in uneven deposition and crystal slippage. A chamber wall with flat surfaces would alleviate this problem. Ambient pressure thermal reactors exist which use rectangular quartz chambers to provide uniform reactant gas flow across a wafer. However, these are not reduced pressure or low pressure capable. The pressure differential across a flat surface would cause localized stress and subject it to breakage.

Stressing of flat and other non-cylindrical walls due to pressure differential can be addressed by using greater wall thicknesses. However, thick walls provide too much thermal insulation. The effectiveness of the external coolant, typically air, in reducing chamber wall temperatures would be reduced, leading to increased chemical deposition on the inner surfaces of the wall. Furthermore, the hotter inner surfaces would tend to expand more rapidly than the outer surfaces, causing the chamber wall to crack. Additional design objectives result in conflicting preferences between thin chamber walls, for both reduced thermal stresses and wall deposition versus thicker walls to reduce pressure-caused stresses.

The requirement for uniformity also applies to chamber cooling. As indicated above, a coolant fluid is passed across the outer surface of the chamber wall to minimize depositions on the chamber wall and distortions due to thermal expansion. Generally, coolant fluid is applied through nozzles near or behind the heat source. Coolant flow generally is not controlled at the chamber wall surface so that eddies and other flow irregularities can result. This can cause differential cooling across the chamber wall, resulting in local depositions and uneven stresses which could crack the chamber wall.

While pressure differentials are most commonly encountered in sub-ambient pressure procedures, they also apply to procedures conducted at above ambient pressure. For example, many procedures considered as ambient pressure procedures are so only when the ambient pressure is about 760 Torr. A laboratory in an elevated location, e.g., Denver, might need to pressure a reaction vessel to carry out such a procedure. The conflicting design objectives applicable to sub-ambient pressure processing would also apply to such cases of above-ambient pressure processing.

What is needed is a thermal reactor system for semiconductor processing which provides for processing with elevated temperatures, non-ambient pressures and uniform reactant flows. In addition, heating and cooling uniformities should be provided.

SUMMARY OF THE INVENTION

A thermal reactor system for semiconductor processing comprises a reaction vessel, a wafer support within the vessel, a gas source, a vacuum system, seals through which the gas source and vacuum system communicate with the reaction vessel, a heat source, and a coolant source. The reaction vessel includes a quartz tube and gussets surrounding the tube. The inner wall of the quartz tube defines the reaction chamber, while the quartz gussets are disposed on the outer surface of the chamber wall.

The present invention provides for a wide variety of tube geometries. Improved reactant gas flow uniformity results when the tube is flatter than a cylindrical tube. Ellipsoidal tubes are provided for where the wafer to be processed is orthogonal to the minor axis of an ellipsoidal cross section of the tube. Herein, "ellipsoidal" refers to cross sections which are elliptical, as well as shapes that can be characterized as oblated circles, such as ovals and lenticulars. Preferably, a flat tube surface is opposed to the wafer surface to bear circuit devices. Accordingly, a rectangular tube is favored, again with the wafer orthogonal to the minor diameter, the line segment midway between the shorter sides. Alternatively, a tube with an oval cross section, the oval having two parallel sides can be used. Also, a tube with a flat surface above a wafer and a curved surface below the wafer can be used. In general, a wafer surface to be patterned should face a relatively large radius of curvature, with the radius of curvature of a flat surface being infinite.

The gussets can be preformed of quartz and mounted in position about the quartz tube. The gussets can be fused using localized heating from a torch or other heat source. Additional bits of quartz can be used in the fusing procedure, just as bits of metal can be used in a brazing operation. The gussets can be monolithic. Alternatively, the gussets can be formed of two or more segments which are fused end-to-end in position on the quartz tube. The vessel is annealed at least once during the attachment of the gussets to relieve stressed thermally induced during fusion.

The quartz gussets provide additional strength to avoid tube distortion under pressure during non-ambient pressure procedures. Preferably, the gussets are arranged as parallel ridges which extend circumferentially about the tube so as to provide coolant flow control for more effective cooling. Lamps of an infrared heat source can be staggered relative to the gussets to minimize shadowing by the gussets to maintain the advantages of the rectangular geometry in providing more uniform heating. These and other features and advantages of the present invention are apparent from the description below with reference to the following drawings.

DESCRIPTION OF THE PREFERRED EMBODIMENTS

Figure 1:
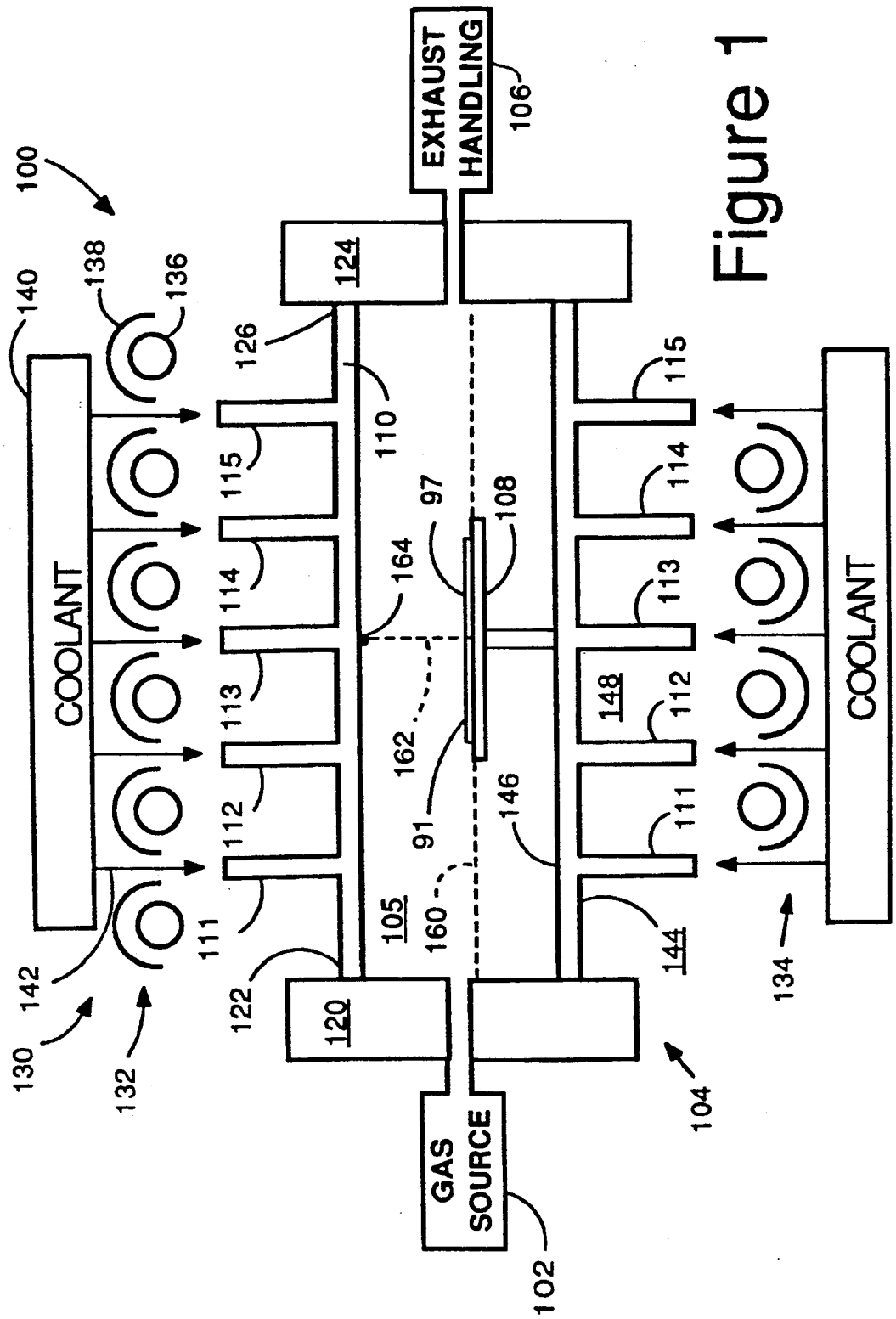
FIG. 1 is a schematic illustration of a thermal reactor system for semiconductor processing in accordance with the present invention.

In accordance with the present invention, a thermal reactor system 100 includes a gas source 102, a reaction vessel 104, and an exhaust handling subsystem 106. A pedestal 108 supports and positions a planar semiconductor wafer 91 within the reaction chamber 105, which is the interior of reaction vessel 104. Reaction vessel 104 comprises a longitudinally extending rectangular quartz tube 110 and fourteen quartz gussets, five of which 111-115 are shown, fused to the outer surface 144 of quartz tube 110.

Gas source 102 communicates with reaction chamber 105 through an inlet seal 120 at the inlet end 122 of quartz tube 110. Exhaust handling subsystem 106 communicates with reaction chamber 105 through an outlet seal 124 at an outlet end 126 of quartz tube 110. Quartz tube 110, inlet seal 120 and outlet seal 124 cooperate to seal chamber 105 from ambient gases so that reduced and low pressures can be established therein by exhaust handling subsystem 106.

A heat source 130 comprises an upper array 132 and a lower array 134 of infrared lamps 136 with reflectors 138. Infrared lamps 136 are external to reaction vessel 104. Infrared radiation is transmitted by infrared lamps 136 through quartz tube 110 for heating wafer 91. Infrared lamps 136 are arranged in a staggered relationship relative to quartz gussets 111-115 to minimize shadowing of infrared radiation at wafer 91.

A coolant source 140 provides a coolant flow 142 against outer surface 144 of quartz tube 110. The purpose of the coolant flow is to cool quartz tube 110 during thermal reactions to minimize depositions at its inner surface 146. Such deposition would diminish the transmissivity of quartz tube 110, which would increase the amount of heat required from heat source 130 required to process wafer 91. In addition, depositions on quartz tube 110 are a potential contaminant for subsequent processes conducted using thermal reaction system 100. In addition, coolant flow 142 is used for cooling reaction vessel 104 and enclosed wafer 91 once thermal processing is completed.

The illustrated coolant source 140 forces ambient air between infrared lamps 136 and against outer surface 144 of quartz tube 110. Gussets 111-115 define coolant channels 148 which guide coolant circumferentially about quartz tube 110, as indicated in FIG. 2, to provide more effective cooling.

Figure 2:
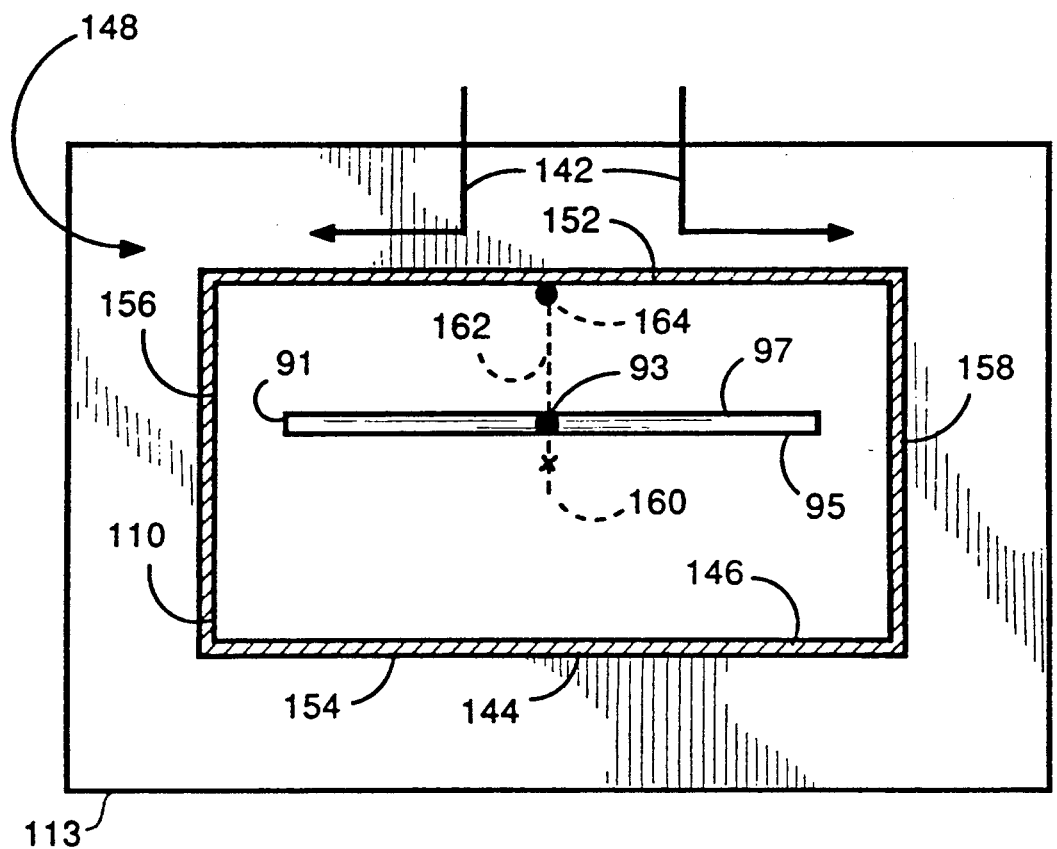
FIG. 2 is a sectional view of a reaction vessel of the system of FIG. 1.
Figure 3:
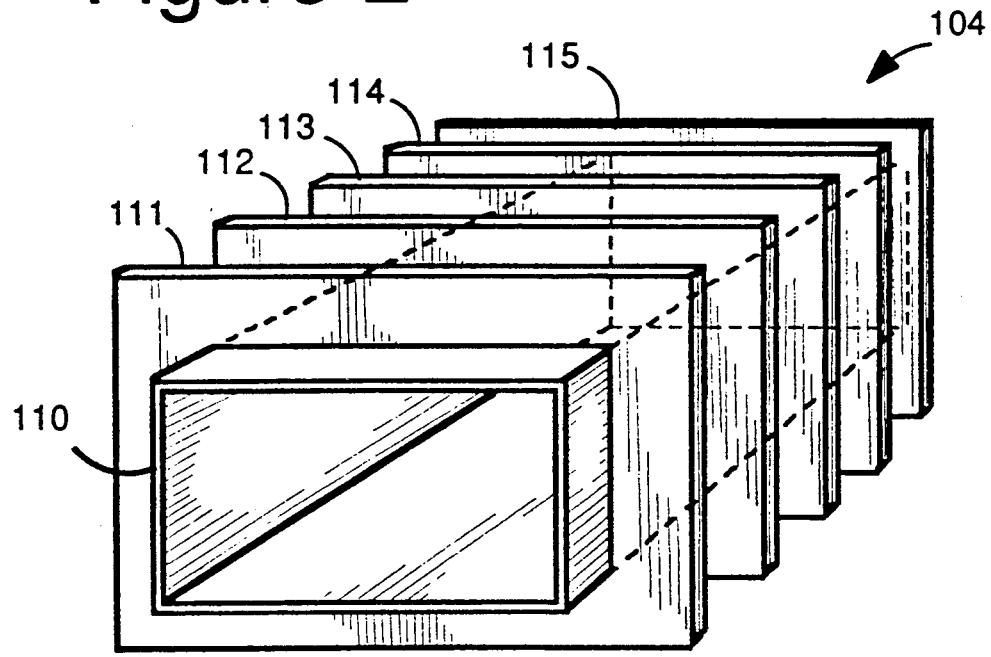
FIG. 3 is a perspective view of the reaction vessel of the system of FIG. 2.
Figure 4:
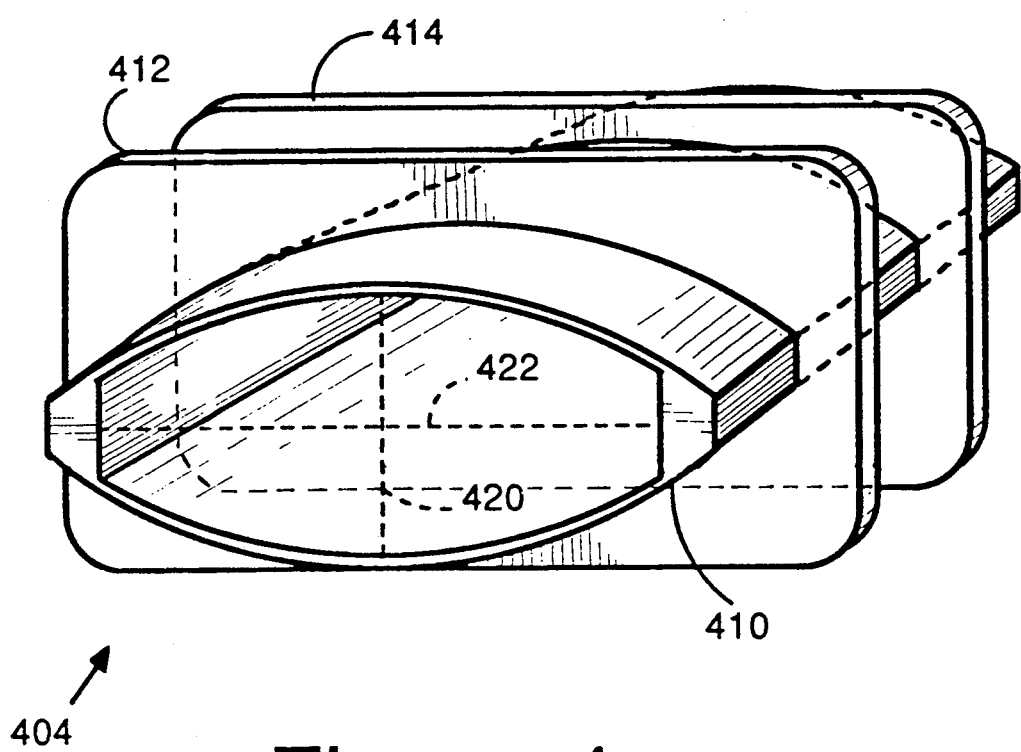
FIG. 4 is a perspective of an alternative reaction vessel incorporable in the system of FIG. 1.

As best seen in FIGS. 2 and 3, quartz tube 110 has a rectangular cross section with two longer sides, i.e., top 152 and bottom 154, and two shorter sides 156 and 158. Wafer 91 is supported so that it lies parallel or nearly parallel to top 152. Thus, the spacing between wafer 91 and top 152 is substantially constant. Therefore, the reagent gas flow over wafer 91 does not very significantly over the transverse extent of wafer 91. This, in turn, provides for more uniform depositions and alternative reactions that can be implemented using thermal reactor system 100. Gussets 111-115 also have rectangular cross sections to conform to quartz tube 110.

The illustrated quartz tube 110 is 19" long. The interior cross section is 3.5" by 11.5", and the tube wall is 0.16" thick. The gussets are basically rectangular and about 0.25" thick. The gussets are arranged in parallel and spaced longitudinally on a 1.125" pitch.

The gussets can be monolithic or formed from segments fused together at their ends. Each gusset can be placed in position about the quartz tube and fused under local heating using a torch. Similar to a brazing procedure, bits of quartz can be applied between the outer surface of the quartz tube and the contacting surface of the gussets to promote a secure bond. A segmented gusset can be fused together before or after fusion to the quartz tube. At least once, and preferably at multiple points during the fusion of the gussets, thermal annealing is used to remove local stresses induced by the fusion procedure. In an alternative, but expensive, procedure, the gussets are formed monolithically with the tube in a casting procedure.

While rectangular quartz tubes have been employed in thermal reactor systems, they have been avoided in systems designed for non-ambient pressure operation. The reason for this is that the stress induced by pressure differential across the rectangular quartz tube could break it. There are many ways to reduce this stress, but most of them have offsetting disadvantages. For example, lowering the pressure outside the reaction vessel would be difficult and expensive. Thickening the quartz tube would increase the amount of deposition on the inner wall of the vessel. In addition, the thicker wall would be more subject to breakage due to thermal expansion. Alternative materials, which might be less subject to breakage, tend to have adverse characteristics relating to heat transfer and/or contamination.

The quartz gussets fused to the exterior of the rectangular quartz tube provide the strength required to resist distortion without incurring significant offsetting disadvantages. In fact, the gussets define coolant flow channels which can enhance cooling of the quartz tube. Staggering infrared lamps relative to the gussets minimizes optical distortion. "Gussets" refers generally to rigid reinforcement elements, herein.

The present invention provides for alternative tube geometries. For example, a reaction vessel 404, including quartz tube 410 and gussets 412 and 414 fused thereto, has an ellipsoidal cross section. The ellipsoidal cross section of tube 410 is formed by two opposing circular arcs joined by sides. While reaction vessel 404 does not provide the reactant flow uniformity of rectangular vessel 104, it does offer a significant improvement in flow uniformity relative to a cylindrical vessel. On the other hand, ellipsoidal tube 410 distributes stress due to pressure more evenly than rectangular tube 110. Therefore, fewer gussets are required to avoid breakage. Accordingly, only two gussets 412 and 414 are used for reaction vessel 404. Gussets 412 and 414 are positioned similarly the gussets 112 and 114 of vessel 104 so that they are appropriately staggered relative to lamps 136 when vessel 404 is incorporated in thermal reactor system 100.

In general, improved reactant flow uniformity can be achieved when the reaction tube is relatively flat over the wafer. For most appropriate geometries, relative flatness can be measured using an aspect ratio of a diameter orthogonal to a wafer and a diameter parallel to a wafer. For example, quartz tube 410 defines a diameter 420 orthogonal to a wafer position and a diameter 422 which is parallel to a wafer position. Diameter 420 is shorter than diameter 422 so that the aspect ratio of tube 410 is less than unity. A cylindrical tube has an aspect ratio of one. Flatter shapes would have smaller aspect ratios. The "diameters" of a rectangle are basically the same as its side lengths.

Aspect ratio is useful where the tube has a plane of symmetry parallel to the wafer. However, one can envisage a tube with a flat surface above a wafer and a curved surface below the wafer. Therefore, a more precise characterization of flatness of the surface of interest follows. Each tube has a longitudinal axis, for example, quartz tube 110 has longitudinal axis 160, shown in FIGS. 1 and 2. A radius is defined by a directed segment that extends orthogonally from the longitudinal axis to a point on the inner surface of the tube. For example, radius 162 extends orthogonally from longitudinal axis 160 and to point 164 on inner surface 146 so that radius 162 is orthogonal to wafer 91. Preferably, radius 162 intersects wafer 91 at its geometric center 93.

The inner surface bearing point 164 has a radius of curvature defined in a plane through the point 164 and orthogonal to longitudinal axis 160 of tube 110. The radius to the projection point also has a magnitude, i.e., its length. When the radius and radius of curvature associated with selected point are equal, the tube is cylindrical, at least locally about the projection point. When the radius is larger than the radius of curvature a condition for poorer reactant uniformity exists. Improve reactant flow uniformity exists when the magnitude of the radius of curvature at the projection point is substantially greater than the magnitude of the radius to the projection point. In fact, this relationship should hold for all points which are upward projections of the wafer onto the inner surface of the tube. When the inner surface is flat, the radius of curvature is infinite and, by definition, greater than the actual radius.

"Above" can be defined more formally as the direction in which the projection must lie relative to the wafer so that the wafer surface of interest is between the projection point and the other wafer surface. In general, only one side of a wafer is to bear circuit devices, and it is this side over which reactant flow should be uniform. Normally, this side is facing up in a reaction vessel. More generally, it is facing away from the support which contacts the other side. For example, pedestal 108 supports wafer 91 by contacting wafer bottom face 95, while wafer top face 97 is the face in which devices are being defined. If both wafer sides are supported, the projection point can be either above or below the wafer.

Thus, the present invention provides for rectangular tubes and tubes which are "between" rectangular and cylindrical, and it also provides for geometries in which one or more walls are curved inward. Thinner cylindrical tubes are also made possible using the gussets. The illustrated tubes 110 and 410 exhibit symmetry about a plane orthogonal to the wafer and a plane parallel to the wafer, both planes including the horizontal axis. The symmetry about the plane orthogonal to the wafer enhances uniformity. Tubes which are not symmetrical about a plane parallel to the wafer are provided for by the present invention.

The present invention provides for a variety of quartz tube materials. Fused silica, which is 99% pure silicon dioxide, is a preferred material for the tube. However, other glass compositions can provide certain advantages, e.g., a lower thermal coefficient of expansion, where the balance of the quartz material does not compromise the thermal reaction. Different heat sources and coolant sources can be used. For example, heat sources using electro-magnetic radiation other than infrared, as well as inductive or resistive heat sources can be used. Means for establishing pressure differentials between the inner and outer surfaces of a quartz tube can be used which are not based on a vacuum; for example, means for maintaining an above-ambient pressure within a reaction chamber can be used. These and other variations upon and modifications to the described embodiments are provided by the present invention, the scope of which is limited only by the following claims.

What is claimed is:

1. A method for processing semiconductor wafers comprising:

positioning a wafer within an elongated quartz tube having a non-circular cross section;

flowing reactant gas longitudinally through said tube under non-ambient pressure;

heating said wafer by radiating energy through a wall of said tube; and reinforcing said tube against the differential between the respective gas pressures inside and outside the tube by applying external reinforcement members to the tube, said members being positioned so as to permit most of said radiated energy to pass through said wall of the tube without being obstructed by said members.

2. A method for processing semiconductor wafers as recited in claim 1 wherein said external reinforcement means are at least partially made from quartz.

3. A method for processing semiconductor wafers as recited in claim 1 wherein said tube has a rectangular cross-section.

4. A method for processing semiconductor wafers as recited in claim 1 wherein said tube has an ellipsoidal cross-section.

5. A method for processing semiconductor wafers as recited in claim1 wherein said reinforcement means includes planar gussets bonded to said outer surface of said tube and arranged parallel to each other.

6. A method for processing semiconductor wafers as recited in claim 1 wherein said non-ambient pressure is a less than ambient pressure.

7. A method for processing semiconductor wafers as recited in claim 1 wherein said non-ambient pressure is a greater than ambient pressure.

* * * * *